(12) United States Patent
Rashed et al.

(10) Patent No.: US 9,006,100 B2
(45) Date of Patent: Apr. 14, 2015

(54) MIDDLE-OF-THE-LINE CONSTRUCTS USING DIFFUSION CONTACT STRUCTURES

(75) Inventors: Mahbub Rashed, Santa Clara, CA (US); Yuansheng Ma, Santa Clara, CA (US); Irene Lin, Los Altos Hills, CA (US); Jason Stephens, Beacon, NY (US); Yunfei Deng, Sunnyvale, CA (US); Yuan Lei, Sunnyvale, CA (US); Jongwook Kye, Pleasanton, CA (US); Rod Augur, Hopewell Junction, NY (US); Shibly Ahmed, San Jose, CA (US); Subramani Kengeri, San Jose, CA (US); Suresh Venkatesan, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/568,737

(22) Filed: Aug. 7, 2012

(65) Prior Publication Data
US 2014/0042641 A1  Feb. 13, 2014

(51) Int. Cl.
*H01L 21/4763* (2006.01)
*H01L 27/02* (2006.01)
*H01L 21/8238* (2006.01)
*H01L 21/768* (2006.01)

(52) U.S. Cl.
CPC .... *H01L 27/0207* (2013.01); *H01L 21/823871* (2013.01); *H01L 21/76895* (2013.01)

(58) Field of Classification Search
USPC .......... 438/622, 669, 599; 257/206, 211, 775, 257/E21.59, E23.011, E21.249
See application file for complete search history.

(56) References Cited

U.S. PATENT DOCUMENTS

| | | | |
|---|---|---|---|
| 6,340,632 B1 * | 1/2002 | Fukada et al. | 438/622 |
| 2006/0226474 A1 * | 10/2006 | Ho et al. | 257/326 |
| 2010/0187611 A1 * | 7/2010 | Schiwon et al. | 257/369 |

* cited by examiner

*Primary Examiner* — Kyoung Lee
*Assistant Examiner* — Ratisha Mehta
(74) *Attorney, Agent, or Firm* — Ditthavong & Steiner, P.C.

(57) ABSTRACT

An approach for providing MOL constructs using diffusion contact structures is disclosed. Embodiments include: providing a first diffusion region in a substrate; providing, via a first lithography process, a first diffusion contact structure; providing, via a second lithography process, a second diffusion contact structure; and coupling the first diffusion contact structure to the first diffusion region and the second diffusion contact structure. Embodiments include: providing a second diffusion region in the substrate; providing a diffusion gap region between the first and second diffusion regions; providing the diffusion contact structure over the diffusion gap region; and coupling, via the diffusion contact structure, the first and second diffusion regions.

14 Claims, 5 Drawing Sheets

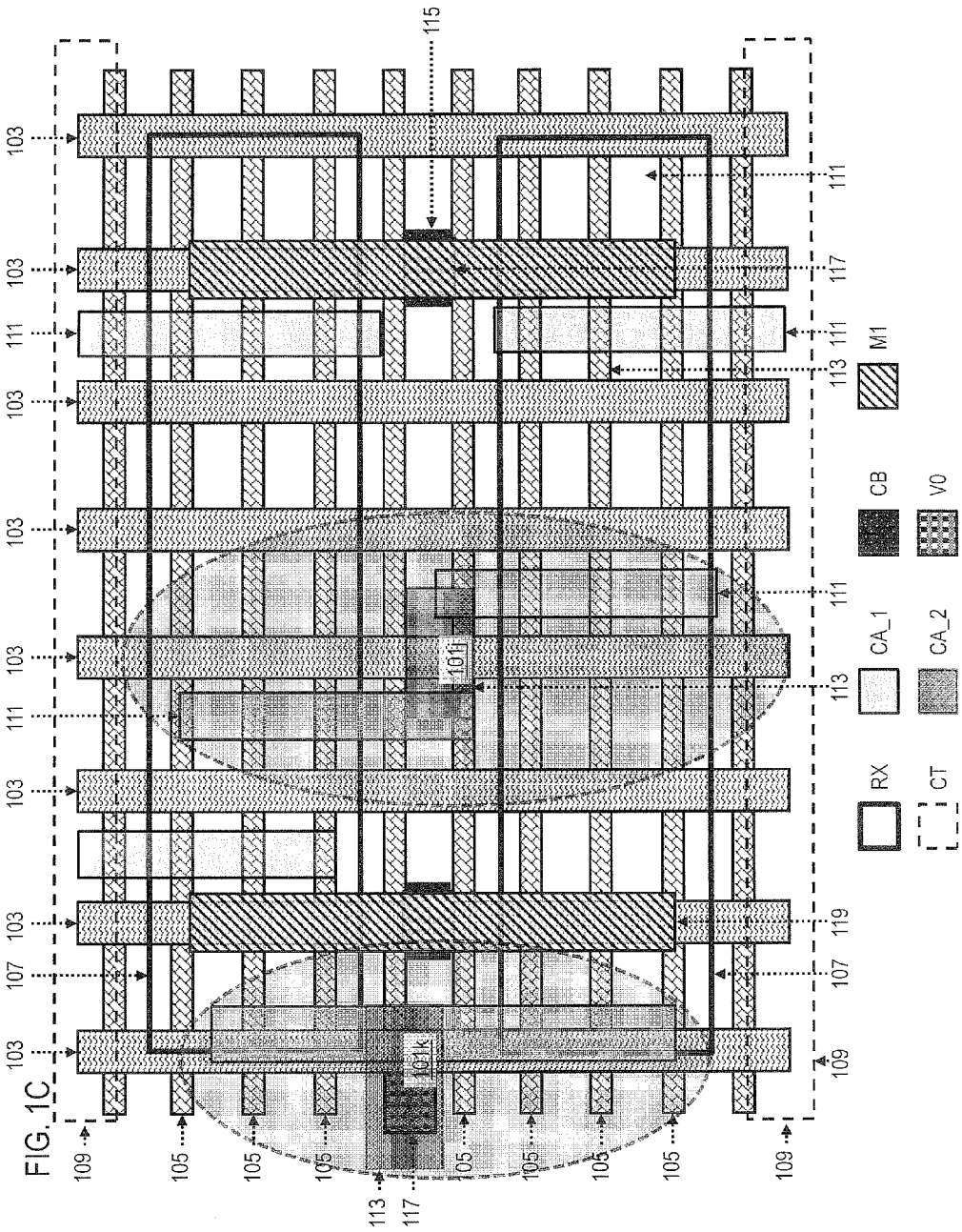

MIDDLE-OF-THE-LINE CONSTRUCTS USING DIFFUSION CONTACT STRUCTURES

TECHNICAL FIELD

The present disclosure relates to middle-of-the-line (MOL) constructs. The present disclosure is particularly applicable to MOL constructs for 14 nanometer (nm) technology nodes and beyond.

BACKGROUND

As technology advances, the importance of logic scaling continues to grow. However, traditional approaches to logic scaling are no longer effective due to lithographic limitations. In recent years, double and triple patterning techniques have been implemented for metal1 layer structures to mitigate the effects of such limitations by enabling metal1 layer structures to be formed closer to each other. However, the use of additional patterning processes also have their limits with respect to logic scaling as a result of increased complexities, high costs, and reliability issues that may be associated with further patterning (e.g., quadruple patterning) of these metal1 layer structures.

A need therefore exists for other logic-scaling-related constructs that do not rely on further patterning of metal1 layer structures, and enabling methodology.

SUMMARY

An aspect of the present disclosure is a method for implementing middle-of-the-line constructs using diffusion contact structures.

Another aspect of the present disclosure is a device implemented with middle-of-the-line constructs using diffusion contact structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first diffusion region in a substrate; providing, via a first lithography process, a first diffusion contact structure; providing, via a second lithography process, a second diffusion contact structure; and coupling the first diffusion contact structure to the first diffusion region and the second diffusion contact structure.

Aspects of the present disclosure include the first and second lithography processes being performed at different times. Additional aspects include: providing a second diffusion region in the substrate; providing, via the first lithography process, a third diffusion contact structure; and coupling the third diffusion contact structure to the second diffusion region and the second diffusion contact structure. Various aspects include providing the first diffusion contact structure to have a first width, and the second diffusion contact structure to have a second width that is different from the first width.

Certain aspects include: providing a first gate structure over the substrate; and providing the second diffusion contact structure over the first gate structure. Some aspects include: providing a second gate structure over the substrate; providing a gate contact over the second gate structure; and providing the second diffusion contact structure to be a pre-designated distance away from the gate contact. Other aspects include: providing a gate contact over the first gate structure; and coupling the second diffusion contact structure to the gate contact. Further aspects include: providing a second gate structure over the substrate; and providing the second diffusion contact structure across the second gate structure to couple the first diffusion contact structure to the gate contact.

An additional aspect of the present disclosure is a device including: a first diffusion region in a substrate; and first and second diffusion contact structures, wherein the first diffusion contact structure is provided via a first lithography process, the second diffusion contact structure is provided via a second lithography process, and the first diffusion contact structure is coupled to the first diffusion region and the second diffusion contact structure.

Aspects include the first and second lithography processes being performed at different times. Additional aspects include a device having: a second diffusion region in the substrate; and a third diffusion contact structure, wherein the third diffusion contact structure is provided via the first lithography process, and the third diffusion contact structure is coupled to the second diffusion region and the second diffusion contact structure. Some aspects include the first diffusion contact structure having a first width, and the second diffusion contact structure having a second width that is different from the first width.

Certain aspects include a device having a first gate structure over the substrate, wherein the second diffusion contact structure is over the first gate structure. Various aspects include a device having: a second gate structure over the substrate; and a gate contact over the second gate structure, wherein the second diffusion contact structure is a pre-designated distance away from the gate contact. Some aspects include a device having a gate contact over the first gate structure, wherein the second diffusion contact structure is coupled to the gate contact. Further aspects include a device having a second gate structure over the substrate, wherein the second diffusion contact structure crosses over the second gate structure and couples the first diffusion contact structure to the gate contact.

Another aspect of the present disclosure includes: providing a first diffusion region in a substrate; providing a plurality of fin structures over the first diffusion region; providing a diffusion contact structure over at least one of the fin structures; and coupling the diffusion contact structure to the first diffusion region.

Additional aspects include: providing a gate structure over the substrate; providing a gate contact over the gate structure; and coupling the diffusion contact structure to the gate contact. Some aspects include the diffusion contact structure being oriented perpendicularly to the gate contact. Further aspects include: providing a second diffusion region in the substrate; providing a diffusion gap region between the first and second diffusion regions; providing the diffusion contact structure over the diffusion gap region; and coupling, via the diffusion contact structure, the first and second diffusion regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1D schematically illustrate various MOL constructs using diffusion contact structures, in accordance with various exemplary embodiments of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of logic scaling limitations attendant upon typical metal1 layer patterning techniques. The present disclosure addresses and solves such problems, for instance, by, inter alia, providing a first diffusion contact structure via a first lithography process, and a second diffusion contact structure via a second lithography process, and coupling the first contact structure to a first diffusion region and the second diffusion contact structure.

Figure 1A:
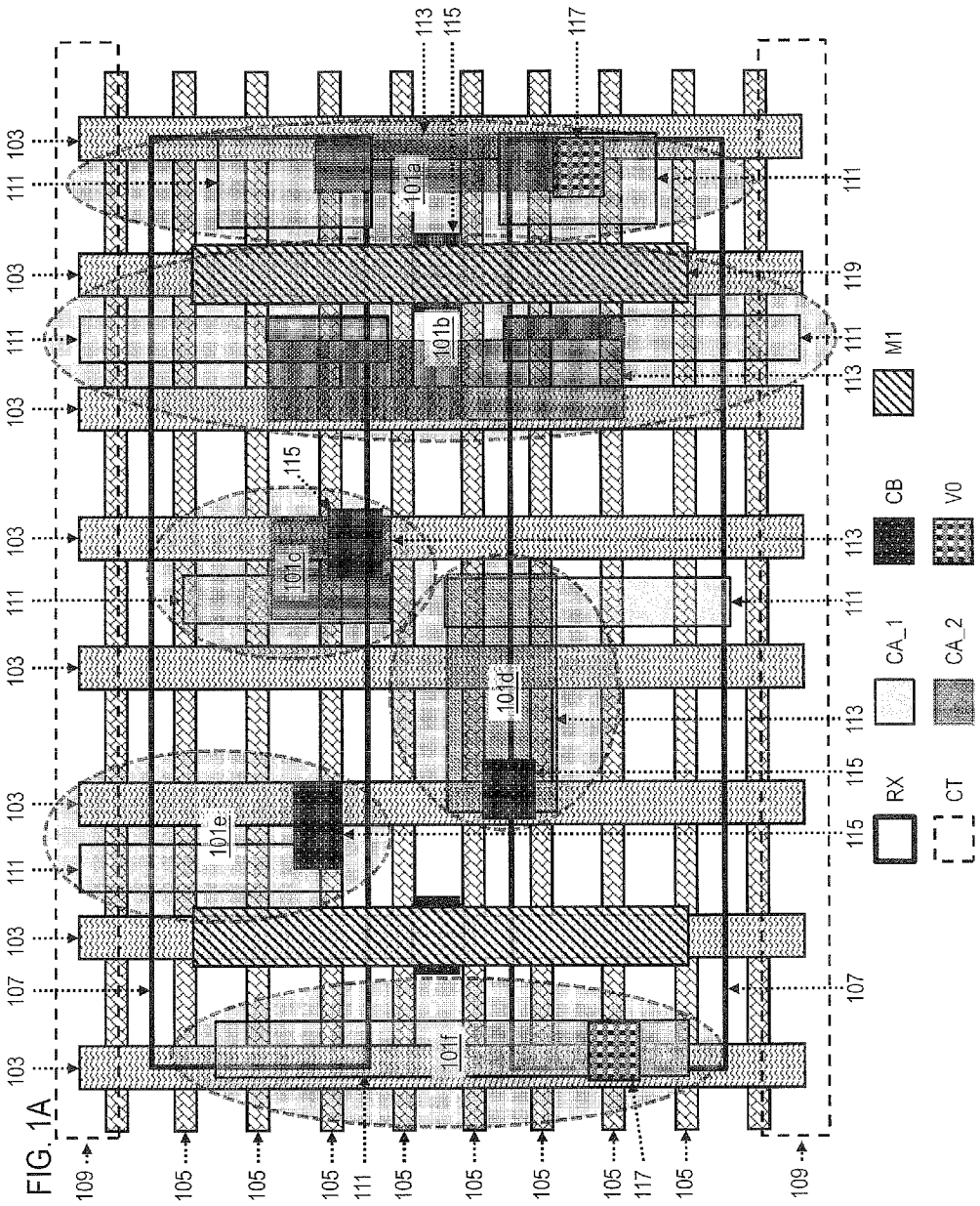

FIGS. 1A through 1D schematically illustrate various MOL constructs, or local interconnects, using diffusion contact structures, in accordance with exemplary embodiments of the present disclosure. For example, FIG. 1A depicts various MOL constructs 101a, 101b, 101c, 101d, 101e, and 101f that may be implemented using or along with gate structures 103, fin structures 105, diffusion regions (RX) 107, gate cut regions (CT) 109, diffusion contact structures (CA) 111 and 113, gate contacts (CB) 115, via0 structures (V0) 117, and metal1 layer structures (M1) 119. As indicated in FIG. 1A, diffusion contact structures 111 are formed through a first patterning process, and diffusion contact structures 113 are formed through a second patterning process.

As shown, construct 101a includes diffusion contact structures 111 and 113 that are stitched together (e.g., using Litho-Etch-Litho-Etch (LELE) techniques) to couple diffusion regions 107 (e.g., to connect drains of NFETs to drains of PFETs), where the diffusion contact structures 111 have widths that are greater than a width of the diffusion contact structure 113 (e.g., with respect to the horizontal orientation of FIG. 1A). On the other hand, construct 101b includes diffusion contact structures 111 and 113 that are stitched together to couple diffusion regions 107 (e.g., to connect drains of NFETs to drains of PFETs), where the diffusion contact structures 111 have widths that are less than a width of the diffusion contact structure 113. As illustrated, the various ways in which diffusion contact structures 111 and 113 are stitched together enable construct 101a to pass by a gate contact 115 to its left and construct 101b to pass by the gate contact 115 to its right without violating a design rule that requires diffusion contact structures 111 and 113 to be at least a predefined distance away from gate contacts 115, for instance, even though certain portions of constructs 101a and 101b are less than the predefined distance away from the gate structure 103 on which the particular gate contact 115 sits.

Construct 101c provides for the coupling of source/drain regions (e.g., of the top diffusion region 107) to a gate structure 103 via the connecting of a diffusion contact structure 111 to a diffusion contact structure 113 and the connecting of the diffusion contact structure 113 to a gate contact 115 that sits over the gate structure 103. Construct 101d provides for the coupling of source/drain regions (e.g., of the bottom diffusion region 107) to a gate structure 103 via the connecting of a diffusion contact structure 111 to one end of a diffusion contact structure 113 that crosses over (and is electrically isolated from) another gate structure 103 and the connecting of the other end of the diffusion contact structure 113 to a gate contact 115 that sits over the gate structure 103.

Construct 101e includes a diffusion contact structure 111 that is over a plurality of fin structures 105 and connected to a gate contact 115 through a CA/CB handshake that enables the coupling of top diffusion region 107 to a gate structure 103 (on which the gate contact 115 sits) without requiring the diffusion contact structure 111 to be over the gate structure 103. Construct 101f includes a diffusion contact structure 111 that is provided over a gate structure 103, a plurality of fin structures 105, and the diffusion gap region between top and bottom diffusion regions 107 to couple source/drain regions of those diffusion regions 107 (e.g., to connect drains of NFETs to drains of PFETs). In this way, constructs 101a, 101b, 101c, 101d, 101e, and 101f allow for further logic scaling (e.g., up to 15% logic scaling benefit), for instance, even without extreme ultraviolet (EUV) techniques, without changes to metal1 layer rules, or without additional patterning for metal1 layer structures. In addition, because the timely availability of EUV for 14 nm and 10 nm technologies is uncertain (e.g., due to the need for some technology breakthroughs that have not yet occurred), innovation of such constructs to scale logic technology at reasonable costs becomes increasingly important for the future.

Figure 1B:
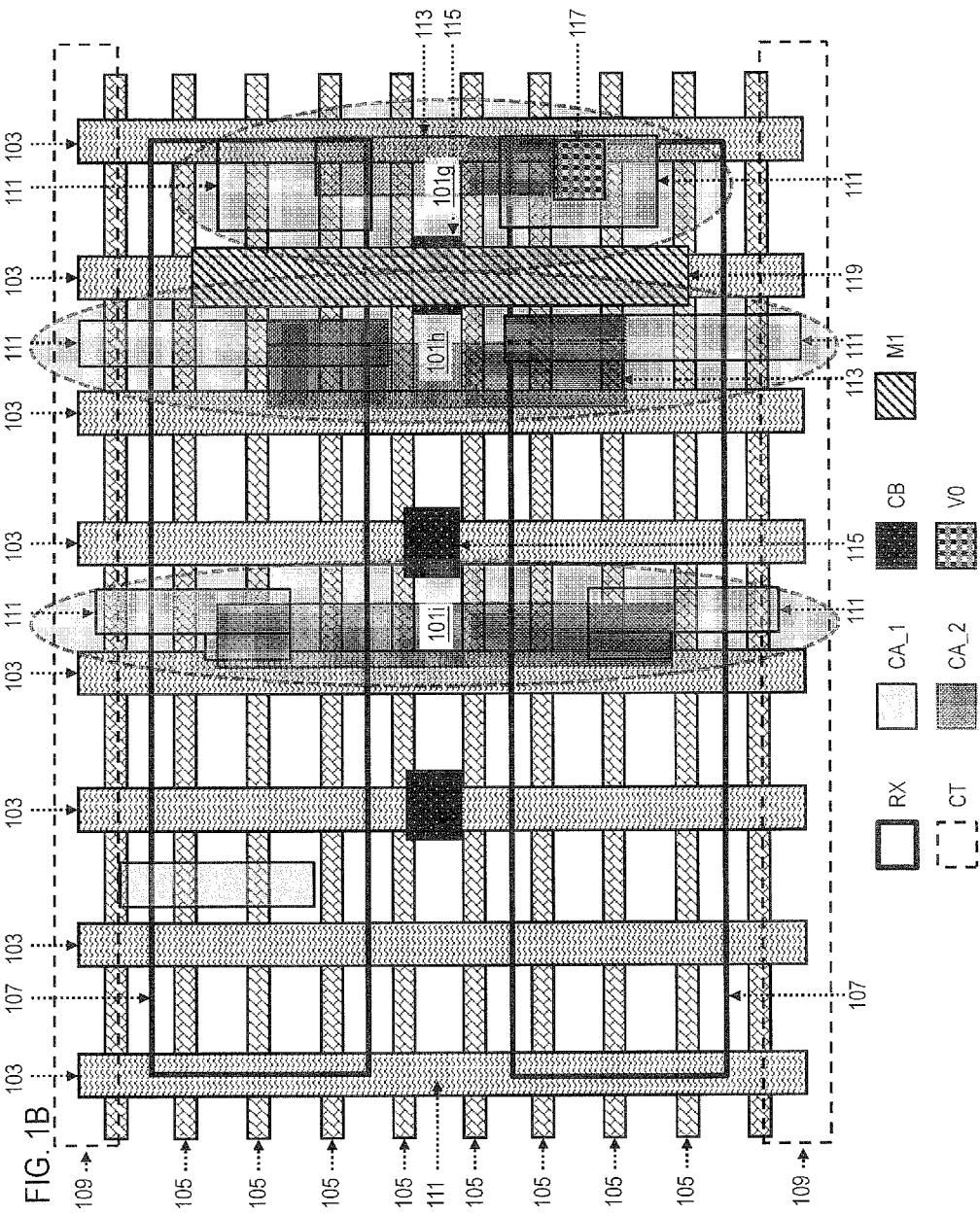

Moreover, FIG. 1B illustrates constructs 101g, 101h, and 101i. Like construct 101a, constructs 101g includes diffusion contact structures 111 and 113 that are stitched together to couple diffusion regions 107 (e.g., to connect drains of NFETs to drains of PFETs), where the diffusion contact structures 111 have widths that are greater than a width of the diffusion contact structure 113. In addition, like construct 101b, each of constructs 101h and 101i includes diffusion contact structures 111 and 113 that are stitched together to couple diffusion regions 107 (e.g., to connect drains of NFETs to drains of PFETs), where the diffusion contact structures 111 have widths that are less than a width of the diffusion contact structure 113. As discussed, the various ways in which diffusion contact structures 111 and 113 are stitched together enable the different constructs 101g, 101h, and 101i to pass by particular gate contacts 115 without violating a design rule that requires diffusion contact structures 111 and 113 to be at least a predefined distance away from gate contacts 115 (e.g., regardless of whether certain portions of the constructs 101g, 101h, and 101i are less than the predefined distance away from a gate structure 103 on which a gate contact 115 sits).

FIG. 1C illustrates constructs 101j and 101k. For example, construct 101j includes a first diffusion contact structure 111 over source/drain regions of the top diffusion region 107, a second diffusion contact structure 111 over source/drain regions of the bottom diffusion region 107, and a third diffusion contact structure 113 that cross over gate structure 103 to connect first and second diffusion contact structures 111. As such, construct 101j may be utilized to couple source/drain regions of the top diffusion region 107 to source/drain regions of the bottom diffusion region 107 that are not between the same two gate structures 103 (e.g., to connect different NFETs and PFETs together), without relying on metal1 layer structures to perform such coupling. In addition, as shown, construct 101j takes advantage of the double diff break region (or the diffusion gap region having two fin structures associated with a set of dummy gates) in between top and bottom diffusion regions 107 (e.g., each having a plurality of source/drain regions) by performing the connection of the first and second diffusion contact structures 111 using the third diffusion contact structure 113 that is over the double diff break region (e.g., to utilize the double diff break regions).

Likewise, construct 101k also takes advantage of the double diff break region between top and bottom diffusion regions 107. Specifically, construct 101k includes a first diffusion contact structure 111 over top and bottom diffusion regions 107, along with a second diffusion contact structure 113 that couples to the first diffusion contact structure 111 at one end and to via0 structure 117 within the double diff break region at another end, for instance, to enable metal1 layer routing that utilizes the double diff break region (e.g., to enable more room within diffusion regions 107 for other purposes).

Figure 1D:
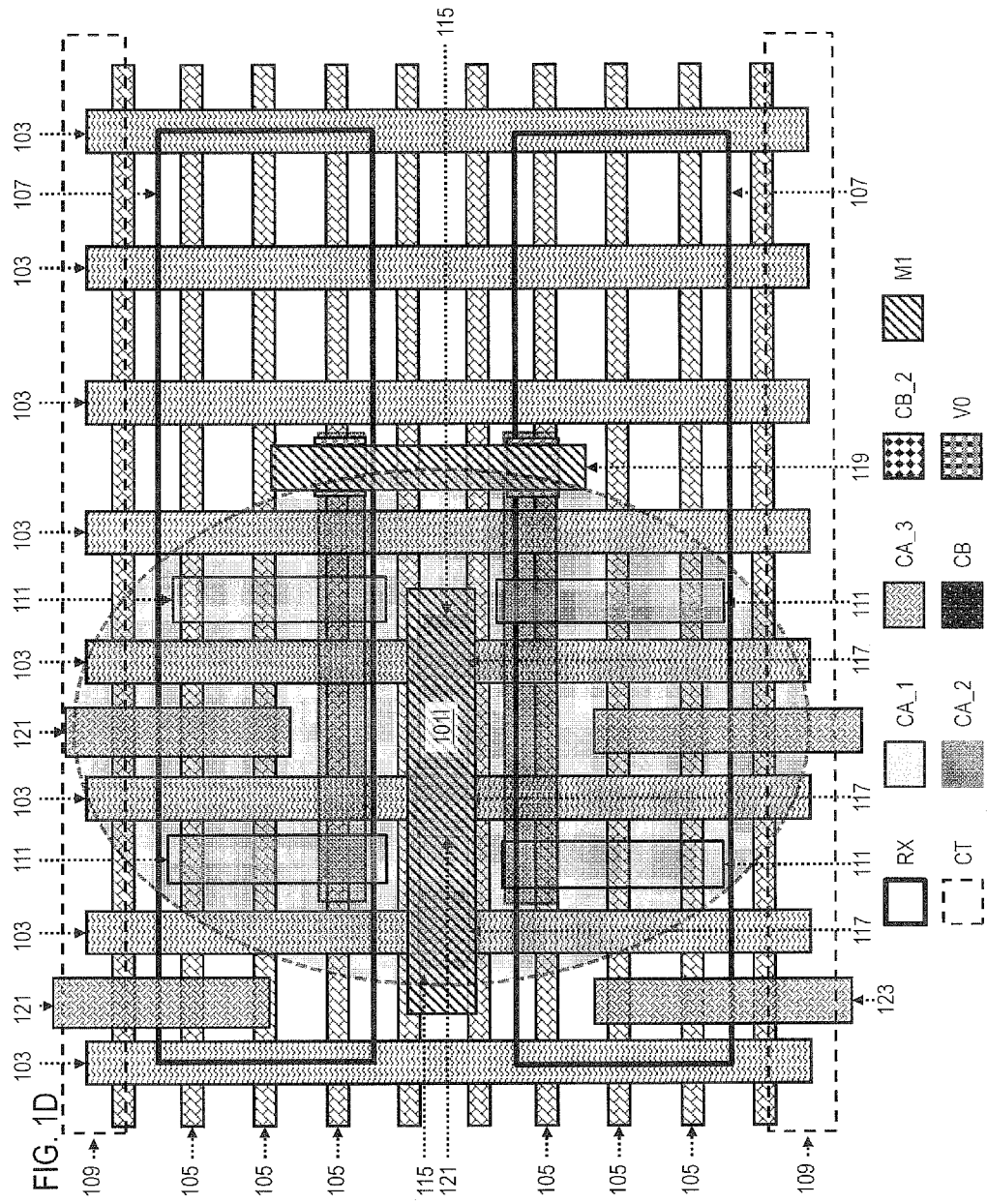

FIG. 1D illustrates construct 101l, for instance, that enables parallel transistor connections using diffusion contact structures 111 and 113 (e.g., to form multi-finger inverters). As shown, construct 101l includes first and second diffusion contact structures 111 over top diffusion region 107, where each of these diffusion contact structures 111 is between two different sets of gate structures 103. Moreover, construct 101l includes third and fourth diffusion contact structures 111 over bottom diffusion region 107, where each of these diffusion contact structures 111 is also between two different sets of gate structures 103. In addition, construct 101l includes fifth and sixth diffusion contact structures 113 that cross over multiple gate structures 103 to respectively connect ends of the first and second diffusion contact structures 111 and ends of the third and fourth diffusion contact structures 111 to two different portions of a metal1 layer structure 119 (e.g., through gate contacts 115 and via0 structures 117). Furthermore, construct 101l may include gate contacts 115 formed through one patterning process and gate contacts 121 formed through another patterning process, along with diffusion contact structures 123 formed through a patterning process that is performed separately from the patterning processes utilized for diffusion contact structures 111 and 113 (e.g., three separate lithography processes may be utilized to form diffusion contact structures 111, 113, and 123).

Figure 2:
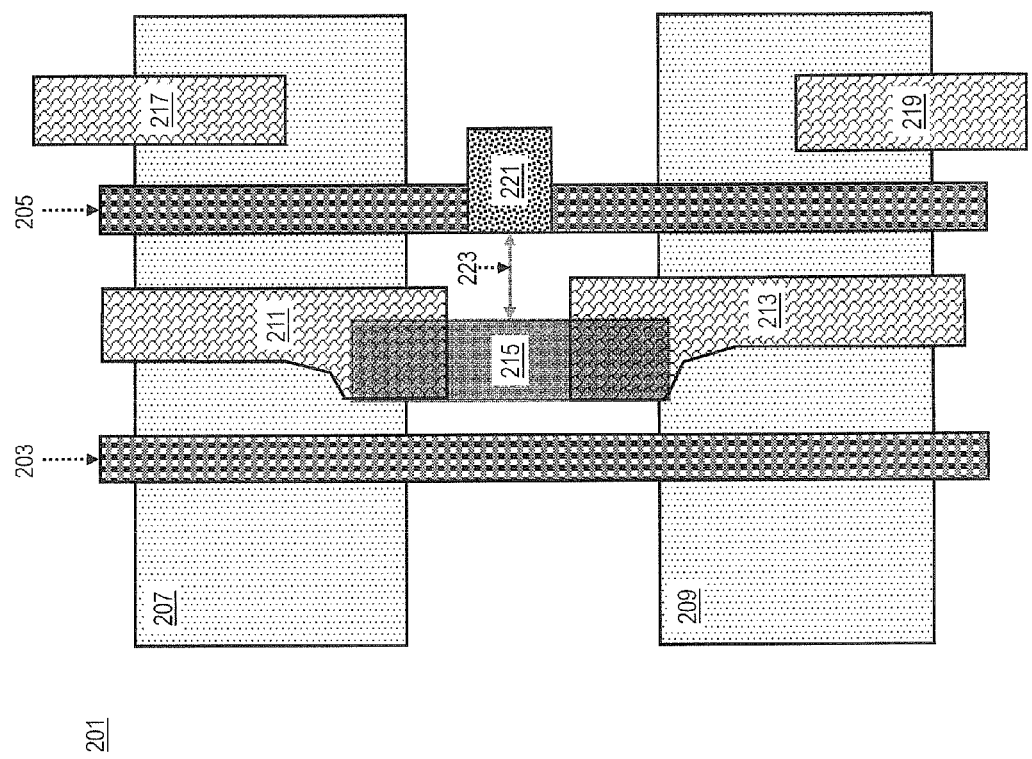
FIG. 2 schematically illustrates additional details with respect to a MOL construct using diffusion contact structures, in accordance with an exemplary embodiment of the present disclosure.

FIG. 2 schematically illustrates additional details with respect to a MOL construct using diffusion contact structures, in accordance with an exemplary embodiment of the present disclosure. For example, FIG. 2 depicts construct 201 with gate structures 203 and 205 over diffusion regions 207 and 209, along with diffusion contact structures 211, 213, 215, 217, and 219, and gate contact 221 over gate structure 205. Diffusion contact structures 211 and 213 may, for instance, be formed through a first patterning process, and diffusion contact structure 215 may be formed through a second patterning process separate from the first patterning process. Diffusion contact structures 217 and 219 may be formed through either the first or second patterning process based on the contact poly pitch (CPP) that construct 201 is associated with.

Construct 201 may be provided by stitching together diffusion contact structures formed by separate patterning processes (e.g., using LELE techniques). For example, one end of diffusion contact structure 215 may be coupled to diffusion contact structure 211, and the other end of diffusion contact structure 215 may be coupled to diffusion contact structure 213. As shown, this stitch-based approach enables diffusion contact construct 201 to pass by gate contact 221 while maintaining at least a predefined distance 223 between construct 201 and gate contact 221, even though certain portions of construct 201 may be less than the predefined distance 223 away from the gate structure 205 on which gate contact 221 sits. In addition, construct 201 may be utilized for a variety of CPP designs (e.g., 90 nm CPP or below), and may reduce the amount of chip area required (e.g., by ~5% even without changes to metal1 rules and capabilities). Other advantages of construct 201 may, for instance, include making 78 nm CPP a viable technology with 64 nm LELE metal1 with respect to 90 nm CPP, and allowing easy migration to EUV designs with a single mask.

The embodiments of the present disclosure can achieve several technical effects, including reduced device size without significant increases in costs, complexities, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in 14 nm and 10 nm technologies nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a first diffusion region in a substrate;
   providing at least one metal1 (M1) layer of the substrate;
   providing, via a first lithography process, a first diffusion contact structure, the first diffusion contact structure being separated from the at least one metal1 (M1) layer of the substrate;
   providing, via a second lithography process, a second diffusion contact structure, wherein the first and second lithography processes are performed at different times; and
   coupling, via a double patterning technique, the first diffusion contact structure to the first diffusion region and the second diffusion contact structure, wherein the coupling of the first diffusion contact structure to the second diffusion contact structure comprises stitching the first and second diffusion contact structures, the stitching comprising providing the first and second diffusion contact structures to include an overlapping area of the first and second diffusion contact structures, and the overlapping area, in a plan view, covers less than all of the first and less than all of the second diffusion contact structures.

2. The method according to claim 1, further comprising:
providing a second diffusion region in the substrate;
providing, via the first lithography process, a third diffusion contact structure; and
coupling the third diffusion contact structure to the second diffusion region and the second diffusion contact structure.

3. The method according to claim 1, further comprising:
providing the first diffusion contact structure to have a first width, and the second diffusion contact structure to have a second width that is different from the first width.

4. The method according to claim 1, further comprising:
providing a first gate structure over the substrate; and
providing the second diffusion contact structure over the first gate structure.

5. The method according to claim 4, further comprising:
providing a second gate structure over the substrate;
providing a gate contact over the second gate structure; and
providing the second diffusion contact structure to be a pre-designated distance away from the gate contact.

6. The method according to claim 4, further comprising:
providing a gate contact over the first gate structure; and
coupling the second diffusion contact structure to the gate contact.

7. The method according to claim 6, further comprising:
providing a second gate structure over the substrate; and
providing the second diffusion contact structure across the second gate structure to couple the first diffusion contact structure to the gate contact.

8. A method comprising:
providing a first diffusion region in a substrate;
providing at least one metal1 (M1) layer of the substrate;
providing a plurality of fin structures over the first diffusion region;
providing first, second, and third diffusion contact structures, the first diffusion contact structure coupled to the first diffusion region, and the third diffusion contact structure coupled to a second diffusion region in the substrate;
providing the second diffusion contact structure over at least one of the fin structures, and overlapping the first and third diffusion contact structures, the second diffusion contact structure being separated from the at least one metal1 (M1) layer of the substrate;

coupling, via a double patterning technique, the second diffusion contact structure to the first diffusion region via the first diffusion contact structure;
providing a diffusion gap region between the first and second diffusion regions;
providing the second diffusion contact structure over the diffusion gap region; and
coupling, via the second diffusion contact structure, the first and second diffusion regions by stitching the second diffusion contact structure to the first and third diffusion contact structures,
wherein a portion of the second diffusion contact structure maintains a predefined distance from a gate contact,
wherein the first and second diffusion contact structures include an overlapping area of the first and second diffusion contact structures, and the overlapping area of the first and second diffusion contact structures, in a plan view, covers less than all of the first and less than all of the second diffusion contact structures, and
wherein the second and third diffusion contact structures include an overlapping area of the second and third diffusion contact structures, and the overlapping area of the second and third diffusion contact structures, in a plan view, covers less than all of the second and less than all of the third diffusion contact structures.

9. The method according to claim 8, further comprising:
providing a gate structure over the substrate;
providing the gate contact over the gate structure; and
coupling the diffusion contact structure to the gate contact.

10. The method according to claim 9, wherein the diffusion contact structure is oriented perpendicularly to the gate contact.

11. The method according to claim 1, wherein the double patterning technique comprises a Litho-Etch-Litho-Etch (LELE) technique.

12. The method according to claim 1, wherein the coupling comprises connecting drains of NFETs to drains of PFETs.

13. The method according to claim 2, wherein the second diffusion contact structure overlaps both the first diffusion contact structure and the third diffusion contact structure, and the overlapping area of the second diffusion contact structure and the third diffusion contact structure covers less than all of the second and third diffusion contact structures.

14. The method according to claim 13, wherein the second diffusion contact structure has a width different from the first diffusion contact structure and the third diffusion contact structure.

* * * * *